United States Patent
Sudo (10) Patent No.: US 11,705,213 B2
(45) Date of Patent: Jul. 18, 2023

(54) SEMICONDUCTOR MEMORY DEVICE CAPABLE OF RE-READING THE SETTING INFORMATION AFTER POWER-ON OPERATION AND OPERATION METHOD THEREOF

(71) Applicant: Winbond Electronics Corp., Taichung (TW)

(72) Inventor: Naoaki Sudo, Yokohama (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/401,401

(22) Filed: Aug. 13, 2021

(65) Prior Publication Data

US 2022/0051740 A1 Feb. 17, 2022

(30) Foreign Application Priority Data

Aug. 17, 2020 (JP) ................................ 2020-137324

(51) Int. Cl.
*G11C 16/34* (2006.01)
*G11C 16/14* (2006.01)
(Continued)

(52) U.S. Cl.
CPC ........ *G11C 16/3495* (2013.01); *G11C 16/102* (2013.01); *G11C 16/14* (2013.01); *G11C 16/26* (2013.01); *G11C 16/3459* (2013.01)

(58) Field of Classification Search
None
See application file for complete search history.

(56) References Cited

U.S. PATENT DOCUMENTS

| 7,254,060 B2 | 8/2007 | Kawai et al. |
| 2008/0170435 A1 | 7/2008 | Tokiwa et al. |

(Continued)

FOREIGN PATENT DOCUMENTS

| JP | 2008-269769 A | 11/2008 |
| JP | 2013-206510 A | 10/2013 |

(Continued)

OTHER PUBLICATIONS

Office Action dated Aug. 11, 2021 in corresponding Japanese Application No. 2020-137324.

*Primary Examiner* — Alfredo Bermudez Lozada
(74) *Attorney, Agent, or Firm* — Birch, Stewart, Kolasch & Birch, LLP (57) ABSTRACT

A semiconductor memory device includes a memory cell array, a memory apparatus and a power-on operation apparatus, and is capable of knowing whether a reading of the setting information which is set during the power-on operation had been completed correctly or not. The flash memory reads the fuse memory when it is detected that the power supply has reached the power-on detection level, and determines whether the reading of the fuse memory had been completed correctly. When not completed correctly, the fuse memory is read again within the maximum read count, and the setting information (which was read from the fuse memory) is written into the CF register. The identification information (that identifies whether the reading of the fuse memory has been completed correctly or not) is stored in the register.

12 Claims, 7 Drawing Sheets

(51) Int. Cl.
*G11C 16/26* (2006.01)
*G11C 16/10* (2006.01)

(56) References Cited

U.S. PATENT DOCUMENTS

| | | | |
|---|---|---|---|
| 2008/0253191 A1* | 10/2008 | Kang | G11C 16/20 |
| | | | 365/185.18 |
| 2013/0258776 A1 | 10/2013 | Nagadomi | |
| 2014/0104947 A1* | 4/2014 | Yamauchi | G11C 16/26 |
| | | | 365/185.09 |
| 2019/0172546 A1 | 6/2019 | Sreeramaneni et al. | |
| 2019/0214095 A1* | 7/2019 | Sudo | G11C 16/26 |

FOREIGN PATENT DOCUMENTS

| | | |
|---|---|---|
| JP | 6494139 B1 | 4/2019 |
| TW | 200939228 A | 9/2009 |

* cited by examiner

SEMICONDUCTOR MEMORY DEVICE CAPABLE OF RE-READING THE SETTING INFORMATION AFTER POWER-ON OPERATION AND OPERATION METHOD THEREOF

FIELD OF THE INVENTION

The present invention is related to semiconductor memory devices such as flash memory, and in particular it is related to the power-on operation that is employed when power is supplied.

DESCRIPTION OF THE RELATED ART

NAND-type flash memory uses fuse memory to store such parameters as operation voltage, timing, internal voltage, and so on, for set operations such as reading, programming, erasing, and so on (information related to set such operations is referred to below as setting information). For example, a fuse memory may be arranged in an area of the memory cell array that cannot be accessed by the user. When the power is turned on, the flash memory reads the setting information stored in the fuse memory and loads it into a register (such registers storing setting information are hereinafter referred to as configuration (CF) registers for convenience) as a power-on operation. After the power-on operation, the controller controls various operations based on the setting information stored in the CF register.

Figure 1:
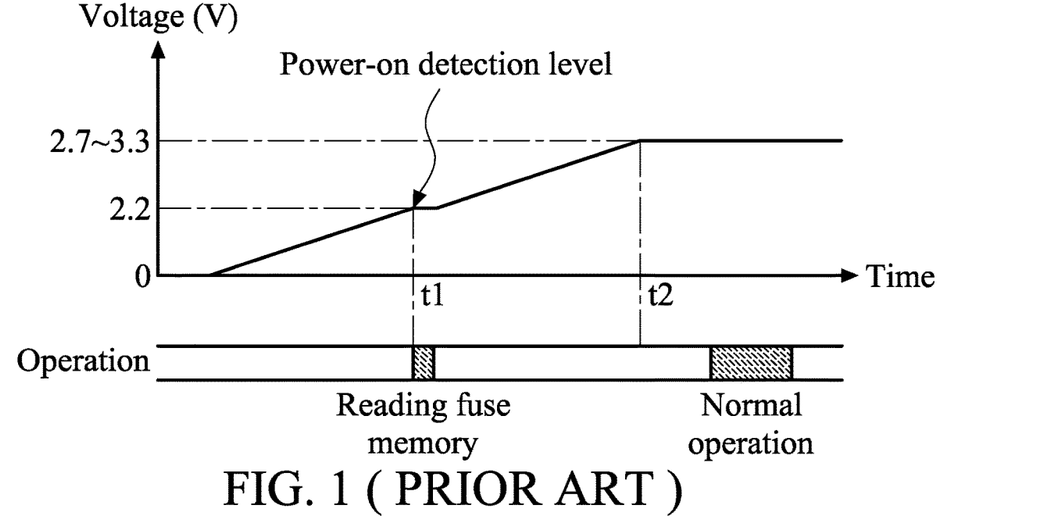
FIG. 1 is a diagram illustrating a power-on operation of a flash memory.

FIG. 1 is a diagram illustrating a power-on operation when a power is turned on to the flash memory. For example, the power supply voltage supplied from the outside is 3.0V, the operation guarantee voltage of the internal circuit is 2.7-3.3V, and the power-on detection level is 2.2V. When the power supply voltage VCC rises to the power-on detection level at time t1 after the power has been turned on, the controller reads the setting information from the fuse memory in response to the power-on detection and stores the read setting information in the CF register. Afterwards, when the power supply voltage VCC rises to the operation guarantee voltage at time t2, and a normal operation can be started.

Since reading from the fuse memory is performed before the power supply voltage rises to the operation guarantee voltage in the power on operation, this means that the reading of the setting information from the fuse memory may be performed at a lower voltage level, so that the reading of the fuse memory becomes unstable. If the power supply capacity on the user side is poor, the fuse memory may not be read correctly due to fluctuations in the power supply voltage or noise, causing incorrect setting information written into the CF register. Therefore, in order to improve reliability, a determination is made as to whether or not the fuse memory had been read correctly. When it had not been read correctly, the fuse memory is read again.

Figure 2:
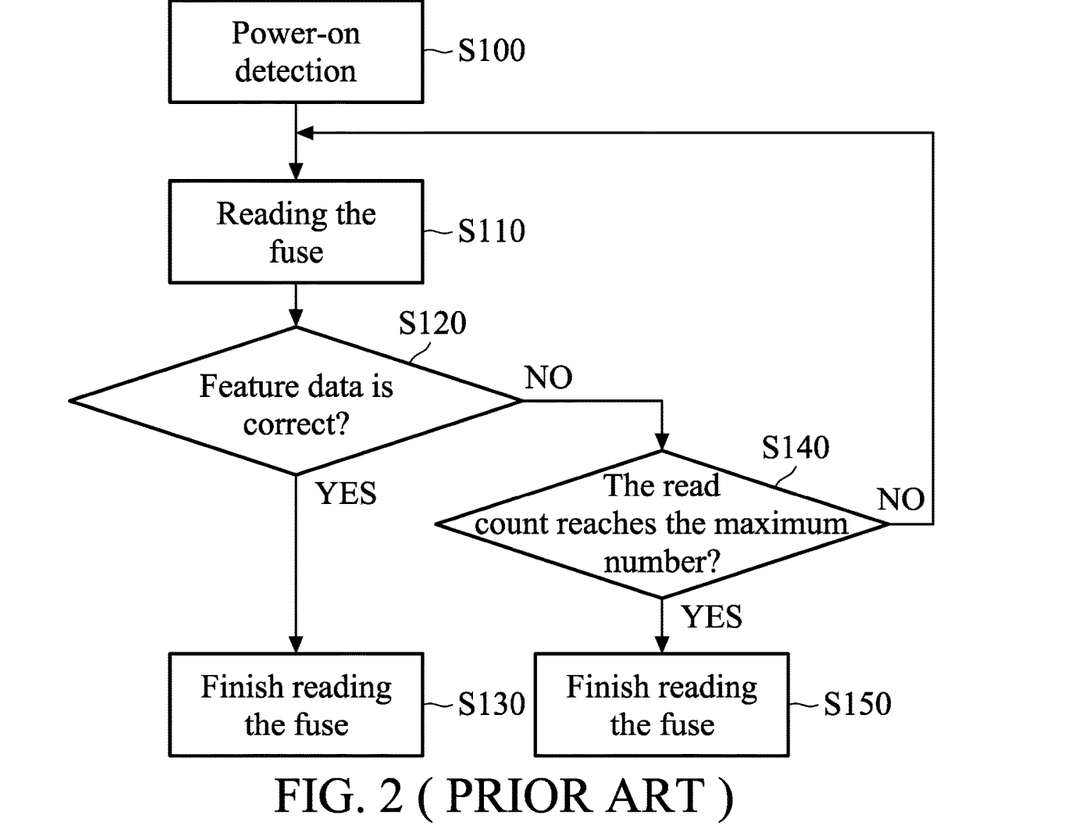
FIG. 2 is a flowchart showing a read operation of a fuse memory during a conventional power-on operation.

FIG. 2 is a flowchart illustrating a conventional read operation for a fuse memory during power-on operation. When the power supply voltage VCC reaches the power-on detection level, a power-on is detected (S100), and the internal controller reads the fuse memory (S110). In addition to the setting information, the fuse memory stores feature data in a specific address that can be read.

The controller checks whether the feature data is correct or not (S120). For example, the feature data is a data type of "0" and "1", like "AAh" or "55h". If the feature data is correct, the controller determines that the fuse memory had been read correctly, and it sets the setting information into the CF register to finish reading the fuse memory (S130).

On the other hand, if the feature data is incorrect, the controller checks whether the fuse memory has been read the maximum number of times (S140). If the fuse memory has not been read the maximum number of times, the fuse memory is read again (S110). If the fuse memory has been read the maximum number of times, the controller writes the setting information into the CF register and finishes reading the fuse memory (S150).

When the feature data read from the fuse memory is incorrect, this means that the setting information read from the fuse memory and written into the CF register may contain errors in cases that finish at step S150. This may lead to incorrect operation due to the use of incorrect setting information (for example, applying an abnormal voltage level or applying voltage at an inappropriate time) in a read operation, a program operation, or an erase operation. In addition, analyzing the cause of incorrect operation can waste valuable time and resources, especially when the user does not know that it is the setting information that is causing the incorrect operation.

Figure 5:
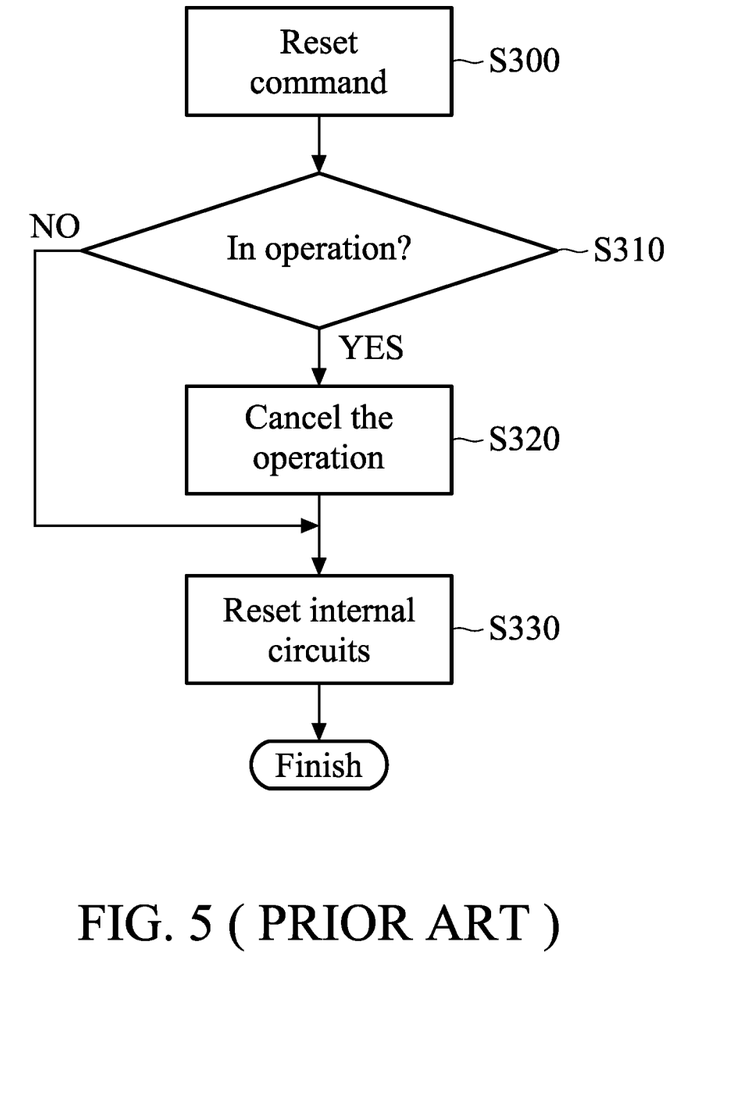
FIG. 5 is a flowchart showing a conventional resetting operation of a flash memory.

FIG. 5 is a flowchart showing a conventional resetting operation. When a reset command is input from outside (S300), the controller 140 checks whether the flash memory is operating: that is, whether it is in a busy state (S310). If it is operating, cancel the operation (S320) and reset internal circuits, including the register (S330).

SUMMARY OF THE INVENTION

The present invention can solve this conventional problem and to provide a semiconductor memory device capable of knowing whether the setting information, which was set during the power-on operation, was read correctly or not. Furthermore, the present invention provides a semiconductor memory device having the function of re-reading the setting information after the power-on operation.

A semiconductor memory device according to the present invention comprises: a memory cell array; a memory apparatus, storing setting information related to operation settings in a non-volatile memory area thereof; and a power-on operation apparatus, reading the setting information from the memory apparatus, writing the setting information read from the memory apparatus into a data-holding unit, and storing identification information identifying whether the setting information had been read correctly or not in response to an external command.

An operation method of a semiconductor memory device according to the present invention comprises: previously storing setting information related to an operation setting in a memory area of a non-volatile memory; reading the setting information from the memory area and determining whether the reading of the setting information had been completed correctly or not when it is detected that a power supply voltage has reached a power-on detection level, and re-reading the setting information when it is determined that reading the setting information had not been performed correctly; writing the setting information read from the memory area into a data-holding unit; storing identification information into a register which is readable, wherein the identification information identifies whether the setting information has reached a maximum number.

DETAILED DESCRIPTION OF THE INVENTION

Next, a semiconductor memory device according to the present invention will be described. A NAND flash memory is exemplified as an embodiment of the semiconductor memory device, but the present invention is not limited to this. The semiconductor memory device may be a memory device having a scheme for reading out setting information from a non-volatile memory in a power-on operation.

Figure 3:
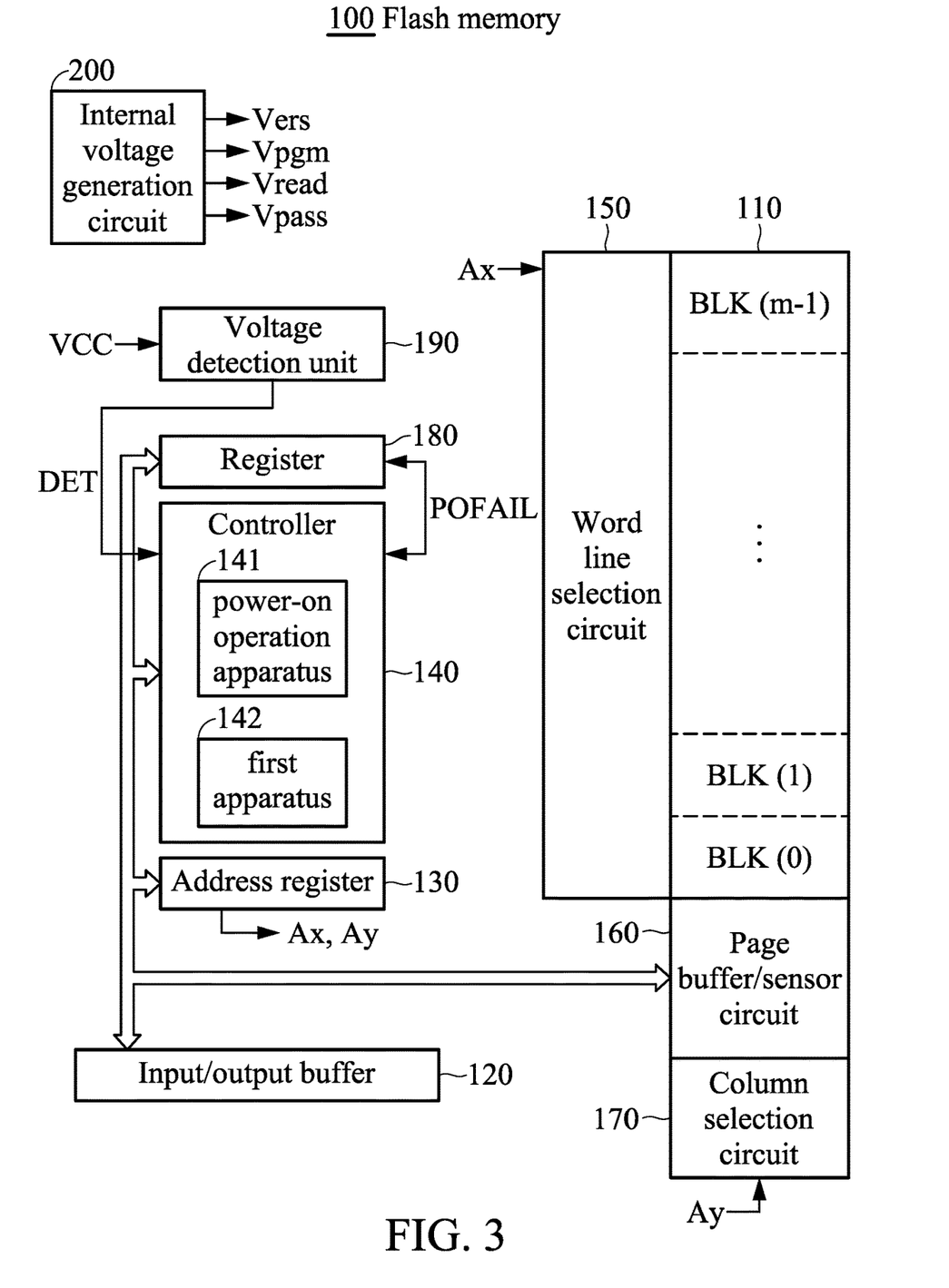
FIG. 3 is a block diagram showing the configuration of a flash memory according to an embodiment of the present invention.

FIG. 3 is a block diagram showing the configuration of a NAND-type flash memory according to an embodiment of the present invention. As shown in FIG. 3, the configuration of the flash memory 100 includes a memory cell array 110, an input/output buffer 120, an address register 130, a controller 140, a word line selection circuit 150, a page buffer/sensor circuit 160, a column selection circuit 170, a register 180, a voltage detection unit 190, and an internal voltage generation circuit 200. A plurality of memory cells are formed in the memory cell array 110. The input/output buffer 120 is connected to an external input/output terminal I/O. The address register 130 receives address data from the I/O buffer 120. The controller 140 receives command data from the input/output buffer 120. The word line selection circuit 150 selects a block and a word line based on the row address information Ax from the address register 130. The page buffer/sensor circuit 160 may hold the read data of the page selected by the word line selection circuit 150. Alternatively, the page buffer/sensor circuit 160 may hold the program data to be programmed into the selected page. The column selection circuit 170 selects a column of the page buffer/sensor circuit 160 based on the column address information Ay from the address register 130. The register 180, for example, is a volatile register. The voltage detection unit 190 detects whether the power supply voltage VCC supplied externally has reached the power-on detection level or not and supplies the detection signal DET to the controller 140. The internal voltage generation circuit 200 generates various voltages (program voltage Vpgm, read voltage Vread, erase voltage Vers, pass voltage Vpass, etc. . . . ) which are required for reading, programming, erasing, and so on.

The memory array 110 comprises m blocks BLK (0), BLK (1), . . . , BLK (m−1). A plurality of NAND strings are formed in one block, and a plurality of memory cells are connected in series to form one NAND string. Furthermore, the memory cell array 110 includes a fuse memory for storing setting information for setting parameters such as the operation voltage or the timing of the flash memory, in an area that is not used (or that is inaccessible) by the user. In addition to this setting information, the fuse memory also stores feature data in a specific address. The feature data is the data used for verifying whether the fuse memory had been read correctly during the power-on operation, and is a data pattern such as "AAh" or "55h," in one exemplary embodiment.

In addition to receiving command data from the input/output buffer 120, the controller 140 also receives the setting information described above, which is used for setting parameters such as the operation voltage or the timing of the flash memory from the fuse memory. The controller 140 writes the setting information into the CF register (not shown in FIG. 3) in the controller 140 to control various operations performed on the flash memory according to the setting information stored in the CF register.

The register 180 stores data indicating various states of the flash memory 100. In this embodiment, identification data POFAIL (used for identifying whether the fuse memory had been read correctly or not during the power-on operation) is stored in a part of the register 180. In an embodiment, the controller 140 receives an external command to read the register 180, and so it reads and outputs the identification data stored in the register 180.

The voltage detection unit 190 detects whether the power supply voltage VCC has reached the power-on detection level. For example, the power supply voltage VCC is 3.0 V, and when the power supply voltage VCC reaches the power-on detection level (for example, 2.2 V) after the power has been turned on, the voltage detection unit 190 outputs the detection signal DET to the controller 140. The power-on detection level is lower than the operation guarantee voltage (for example, 2.7 V to 3.3 V) during the normal operation of the flash memory.

For example, the configuration of the controller 140 includes a microcontroller such as a CPU, a ROM or RAM, or a state machine. For example, a ROM stores programs for performing the power-on operation, the read operation, the program operation, the erase operation, and other operations, and the controller 140 controls each operation by executing these programs.

The controller 140 includes a power-on operation apparatus 141 and a first apparatus 142. When the controller 140 receives the detection signal DET from the voltage detection unit 190, it performs the power-on operation by the power-on operation apparatus 141. Furthermore, when the controller 140 receives a read command, a program command, or an erase command from outside, it performs these operations by the first apparatus 142. In the read operation, a positive voltage is applied to a bit line, 0 V, for example, may be applied to the selected word line, a pass voltage is applied to the unselected word line, the bit line side selected transistor and the source line side selected transistor is turned on, and 0V is applied to the common source line. In the program operation, a high voltage program voltage Vpgm is applied to the selected word line, an intermediate voltage is applied to the non-selected word line, the bit line side selected transistor is turned on, the source line side selected transistor is turned off, and a voltage corresponding to the data of "0" or "1" is supplied to the bit line. In the erase operation, 0V is applied to the selected word line in the block, a high voltage is applied to the P well, and data is erased in block units.

Figure 4:
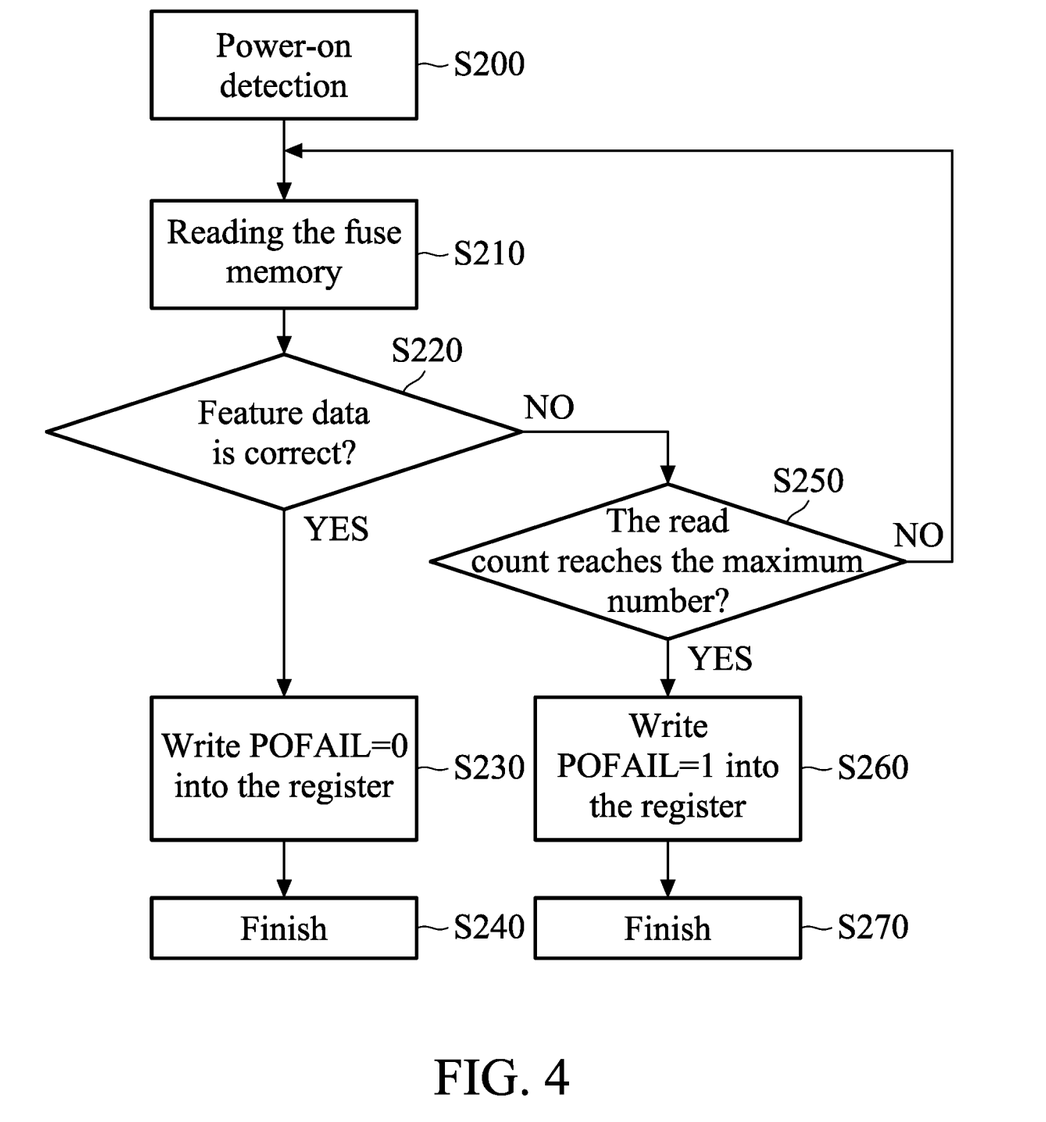
FIG. 4 is a flowchart showing a read operation of a fuse memory during a power-on operation according to an embodiment of the present invention.

FIG. 4 is a flowchart showing a power-on operation according to an embodiment of the present invention. When the power supply is turned on, the voltage detection unit 190 provides the detection signal DET to the controller 140 after it is detected that the power supply voltage VCS has reached the power-on detection level (2.2V) (S200). The controller 140 starts to read the fuse memory in the memory cell array to read out the setting information and feature data stored in the fuse memory in response to the detection signal DET (S210).

The controller 140 compares whether the feature data that has been read out is the same as the expected value: this will determine whether the feature data is correct or not (S220). If the read feature data is the same as the expected value, then the identification data POFAIL=0 is written into the register 180. After writing the setting data (that has been read from the fuse memory) into the CF register (S230), the reading of the fuse memory is finished (S240).

On the other hand, when the feature data does not match the expected value in step S220, this means that errors have occurred during the reading of the fuse memory. The controller 140 checks whether the fuse memory has been read the maximum number of times (S250). If not, the controller 140 returns to steps S210~S220, and redoes the reading of the fuse memory, as well as performing another determination on the feature data. If the read count for the fuse memory reaches the maximum, the identification data POFAIL=1 is written into the register 180. After the setting data (which was read from the fuse memory) is written into the CF register (S260), the reading of the fuse memory (S270) is finished.

It should be noted that in the present embodiment, identification data POFAIL is used to represent whether the setting information had been read correctly before the read count reaches the maximum number. Specifically, identification data POFAIL=0 represents that the fuse memory had been read correctly before the maximum number of retries has been reached, which means that the setting information written into the CF register is reliable. In contrast, identification data POFAIL=1 represents that the fuse memory had not been read correctly before the maximum number of retries (in other words, the feature data is different from the expected value), and therefore the setting information written into the CF register may contains errors.

After the power-on operation, when the power supply VCC reaches the operation guarantee voltage, the flash memory 100 is in a ready state in which the operation can be performed in response to an external command. If the user inputs a command to read the register 180 at an arbitrary time, the controller 140 reads the data in the register 180 in response to the read command and outputs the data that was read by the external terminal. By checking the identification data POFAIL in the register 180, the user can know whether the fuse memory had been read correctly during the power-on operation. If identification data POFAIL=1, the setting information written into the register may contains errors, since the fuse memory had not been read correctly during the power-on operation. The user can redo the power-on operation, and so on.

According to the present embodiment, whether the fuse memory had been read correctly can be determined by the identification data POFAIL stored in the register. When the setting information in the CF register is wrong and leads to an incorrect operation in the flash memory, the user can easily know the cause of the incorrect operation.

Figure 6:
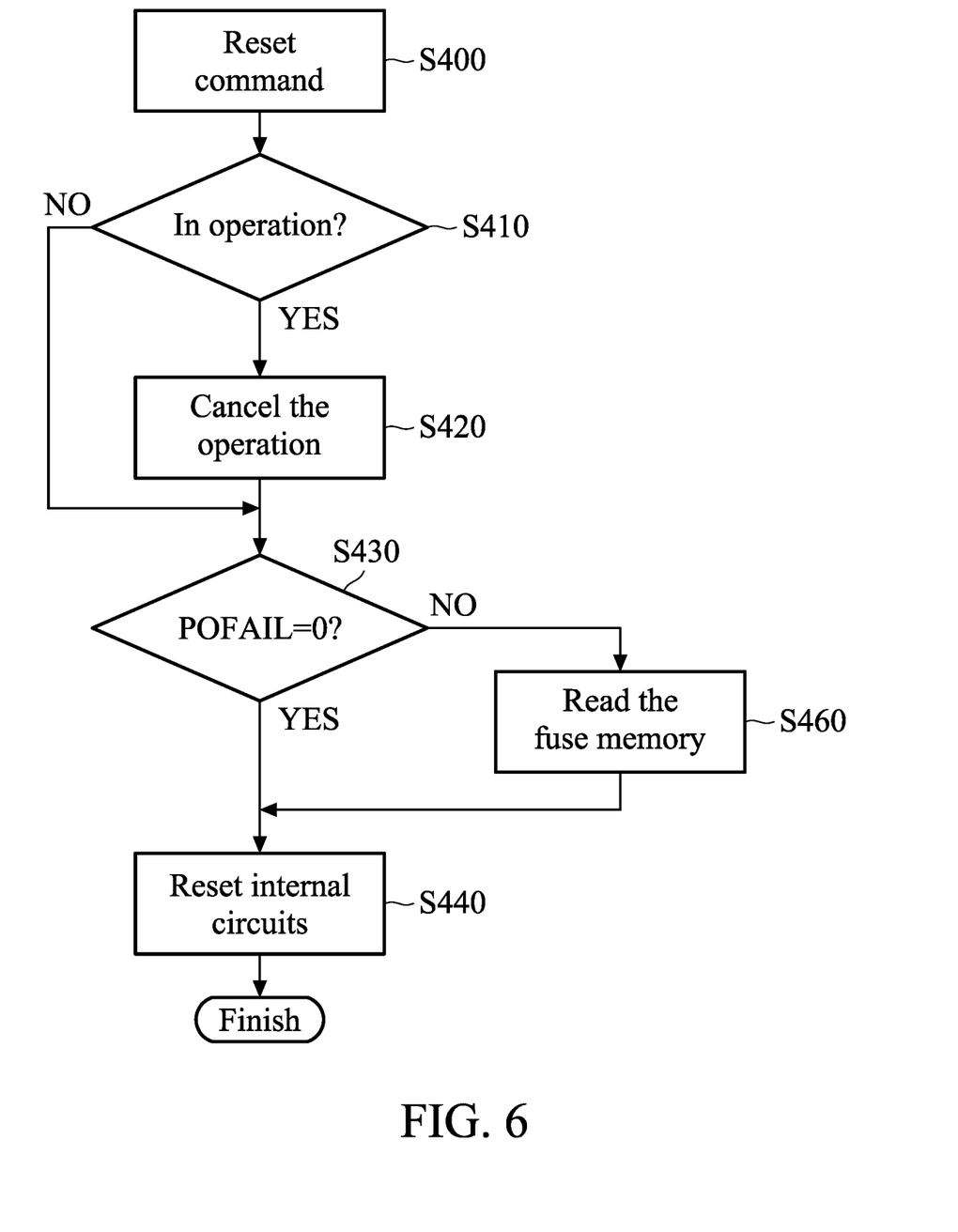
FIG. 6 is a flowchart showing a resetting operation of a flash memory according to a 2nd embodiment of the present invention.

FIG. 6 is a flowchart showing the reset operation of an embodiment of the present invention. The present embodiment involves a re-reading of the fuse memory in response to a reset command from a user. Steps S400 to S420 in FIG. 6 are the same as steps S300 to S320 in FIG. 5, and the description is not repeated here. Furthermore, in this embodiment, the controller 140 checks whether the identification data POFAIL in the register 180 is 0 before resetting the internal circuits (S430). If the identification data POFAIL=0, the internal circuits are reset directly (S440). If the identification data POFAIL=1, the fuse memory is read again and the setting information is written into the CF register 180 (S460), and then the internal circuits are reset (S440).

It should be noted that when executing a reset command, the reading of the fuse memory is more stable than it is during the power-on operation, and it is possible to perform a highly reliable reading, since the power supply voltage VCC of the flash memory has reached the operation guarantee voltage. Therefore, when it is detected that the identification data POFAIL=1 in the reset operation (i.e. the fuse memory had not been correctly read in the power-on operation), re-reading the fuse memory during a reset operation allows the setting information to be rewritten as setting information read during the reset operation, which can reduce the instances of incorrect operation of the flash memory.

Figure 7:
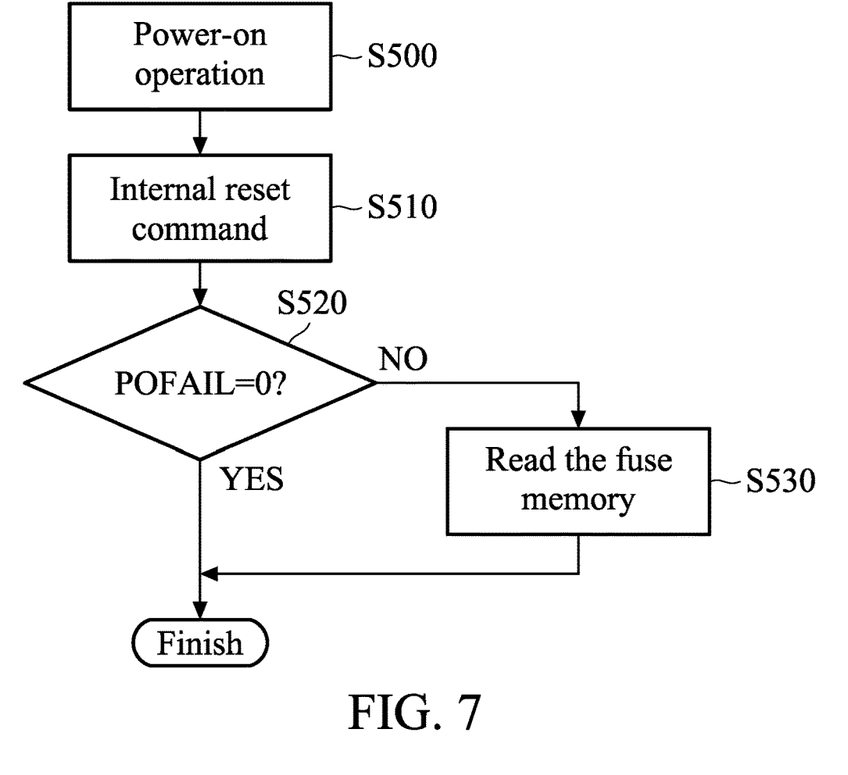
FIG. 7 is a flowchart showing a read operation of a fuse memory of a flash memory according to a 3rd embodiment of the present invention.

FIG. 7 is a flowchart showing the reset operation of another embodiment of the present invention. The present embodiment is re-reading the fuse memory in response to an internal command after the power-on operation. Referring to FIG. 7, after the power-on operation (S500), if the power supply voltage VCC of the flash memory 100 reaches the operation guarantee voltage, the controller 140 performs an internal reset command (S510). In an embodiment, the internal reset command may be automatically executed after a predetermined time from the power-on operation. Next, the controller 140 checks whether the identification data POFAIL in the register 180 is 0 (S520). If the identification data POFAIL=0, the internal circuits are reset directly. If the identification data POFAIL=1, the fuse memory is re-read and the setting information (which has been read) is written into the CF register 180 (S530), and the operation is complete.

According to the present embodiment, by automatically performing an internal reset operation after the power-on operation (i.e. the power supply VCC reaches the operation guarantee voltage), the fuse memory can be re-read whenever it is discovered that the fuse memory was not read correctly during the power-on operation, and highly reliable setting information can be written into the CF register, thereby preventing incorrect operation of the flash memory.

Figure 8:
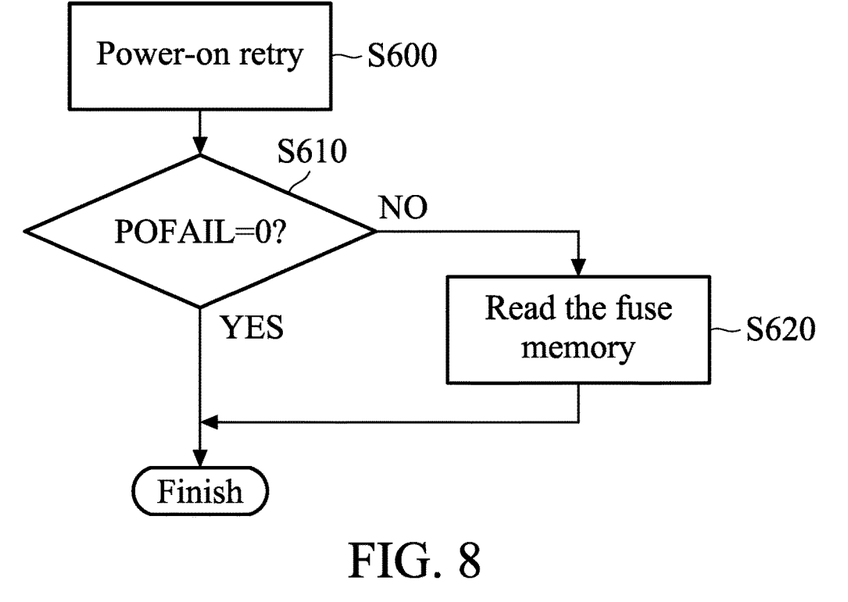
FIG. 8 is a flowchart showing a read operation of a fuse memory of a flash memory according to a 4th embodiment of the present invention.

FIG. 8 is a flowchart showing the reset operation of another embodiment of the present invention. The present embodiment is re-reading the fuse memory in response to a user command that is different from the reset command. Referring to FIG. 8, when a power-on retry command is input from outside (S600), the controller 140 checks whether the identification data POFAIL of the register 180 is 0 according to the power-on retry command (S610). If the identification data POFAIL=0, the operation ends. If the identification data POFAIL=1, the fuse memory is read again, the setting information is written into the CF register 180 (S620), and the operation ends.

In the present embodiment, because the flash memory is also operating with the operation guarantee voltage in the power-on retry command, the reading of the fuse memory is more reliable than it is during the power-on operation, and the correct setting information can be written into the CF register.

Figure 9:
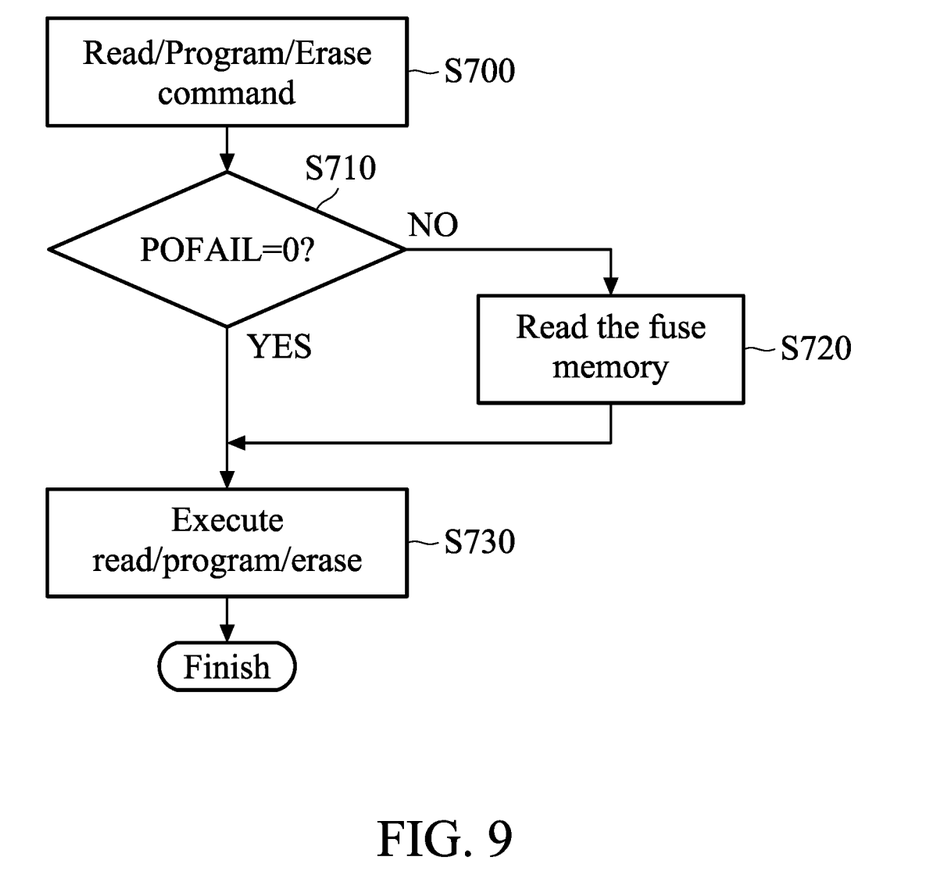
FIG. 9 is a flowchart showing a read operation of a fuse memory of a flash memory according to a 5th embodiment of the present invention.

FIG. 9 is a flowchart showing an operation of an embodiment of the present invention. The present embodiment is re-reading the fuse memory in response to a read, program, erase command, or other command. Referring to FIG. 9, when the controller 140 receives a read, program, or erase command (S700), it will check whether the identification data POFAIL in the register 180 is 0 (S710) before performing these operations. If the identification data POFAIL=0, the operation ends. If the identification data POFAIL=1, the read, program, erase operation, or other operation is performed directly (S730). If the identification data POFAIL=1, the fuse memory is re-read, the setting information is written into the CF register 180 (S720), and then the read, program, erase operation, or other operation is performed (S730).

According to the present embodiment, according to the identification data POFAIL, whether or not the setting information in the CF register includes an error can be checked before reading, programming or erasing. When detecting that the identification data POFAIL=1, the fuse memory can be re-read in order to rewrite the setting information in the CF register. Afterwards, the operation voltage, timing, etc. of the read, program, or erase operation can be set according to more reliable setting information, thereby preventing incorrect operation of the flash memory.

Although NAND-type flash memory has been illustrated in the above embodiment, the present invention can also be applied to a semiconductor memory device that performs a power-on operation. Furthermore, in the above embodiment, the fuse memory is provided in the memory cell array, but the fuse memory may be provided in a different area of the non-volatile memory.

While the invention has been described by way of example and in terms of the preferred embodiments, the invention is not limited to specific embodiments. The scope of the appended claims should be accorded the broadest interpretation so as to encompass all such modifications and similar arrangements.

SYMBOL DESCRIPTION

100: flash memory
110: memory cell array
120: input/output buffer
130: address register
140: controller
150: word line selection circuit
160: page buffer/sensor circuit
170: column selection circuit
180: register
190: voltage detection unit
200: internal voltage generation circuit
S100~S150: steps in the flow chart
S200~S270: steps in the flow chart
S300~S330: steps in the flow chart
S400~S460: steps in the flow chart
S500~S530: steps in the flow chart
S600~S620: steps in the flow chart
S700~S730: steps in the flow chart

What is claimed is:
1. A semiconductor memory device, comprising:
a memory cell array;
a memory apparatus, storing setting information related to operation settings in a non-volatile memory area;
a first apparatus; and
a power-on operation apparatus configured to:
read the setting information from the memory apparatus, write the setting information read from the memory apparatus into a data-holding unit when detecting a power supply voltage has reached a power-on detection level, and store identification information identifying whether the setting information has been read correctly or not into a register in response to an external command, and
determine whether the reading of the setting information has been completed correctly or not, and re-reading the setting information when determining that the reading of the setting information had not been completed correctly,
wherein the identification information is determined based on whether a read count of the setting information has reached a maximum number, and
wherein the first apparatus re-reads the setting information from the memory apparatus and writes the setting information into the data-holding unit, when the identification information indicates that the read count of the setting information has reached the maximum number.

2. The semiconductor memory device as claimed in claim 1, wherein the semiconductor memory device further comprises an output apparatus, which reads the identification information from a register and outputs the identification information to outside.

3. The semiconductor memory device as claimed in claim 1, wherein the first apparatus is a reset apparatus, which performs a reset in response to an external reset command.

4. The semiconductor memory device as claimed in claim 1, wherein the first apparatus is a reset apparatus, which performs a reset in response to an internal reset command after the power-on operation apparatus is activated.

5. The semiconductor memory device as claimed in claim 1, wherein the first apparatus is a reading apparatus, which re-reads the setting information from the memory apparatus and writes the setting information into the data-holding unit when an external command is input when the identification information indicates that the setting information has reached the maximum number.

6. The semiconductor memory device as claimed in claim 1, wherein the first apparatus is a reading apparatus, which reads data from a selected memory cell in the memory cell array in response to an external read command;
the reading apparatus re-reads the setting information from the memory apparatus and writes the setting information into the data-holding unit when the identification information indicates that the setting information has reached the maximum number before performing the read operation.

7. The semiconductor memory device as claimed in claim 1, wherein the first apparatus is a programming apparatus, which performs data programming on a selected memory cell in the memory cell array in response to an external program command;
the programming apparatus re-reads the setting information from the memory apparatus and writes the setting information into the data-holding unit when the identification information indicates that the setting information has reached the maximum number before performing the program operation.

8. The semiconductor memory device as claimed in claim 1, wherein the first apparatus is an erasing apparatus, which erases data from a selected memory cell in the memory cell array in response to an external erase command;

the erasing apparatus re-reads the setting information from the memory apparatus and writes the setting information into the data-holding unit when the identification information indicates that the setting information has reached the maximum number before performing the erase operation.

9. The semiconductor memory device as claimed in claim 1, wherein the power-on detection level is lower than the operation voltage when a command is performed.

10. An operation method of a semiconductor memory device, comprising:

previously storing setting information related to an operation setting in a memory area of a non-volatile memory;

reading the setting information from the memory area and determining whether the reading of the setting information had been completed correctly or not when it is detected that a power supply voltage has reached a power-on detection level, and re-reading the setting information when it is determined that reading the setting information had not been performed correctly;

writing the setting information read from the memory area into a data-holding unit;

storing identification information into a register which is readable, wherein the identification information identifies whether the setting information has reached a maximum number; and re-reading the setting information from the memory area and writing the setting information into the data-holding unit, when the identification information indicates that a read count of the setting information has reached the maximum number in response to a reset command.

11. The operation method of a semiconductor memory device as claimed in claim 10, further comprising:

reading the identification information from the register in response to an external command, and outputting the identification information to outside.

12. An operation method of a semiconductor memory device, comprising:

previously storing setting information related to an operation setting in a memory area of a non-volatile memory;

reading the setting information from the memory area and determining whether the reading of the setting information had been completed correctly or not when it is detected that a power supply voltage has reached a power-on detection level, and re-reading the setting information when it is determined that reading the setting information had not been performed correctly;

writing the setting information read from the memory area into a data-holding unit;

reading identification information from a register which is readable in response to the external command, wherein the identification information identifies whether a read count of the setting information has reached a maximum number; and re-reading the setting information from the memory device and writing the setting information into the data-holding unit when the identification information indicates that the read count of the setting information has reached the maximum number in response to a particular external command.

* * * * *